United States Patent
Tsubata et al.

(10) Patent No.: US 10,177,302 B2
(45) Date of Patent: Jan. 8, 2019

(54) MAGNETIC MEMORY DEVICE INCLUDING UPPER STRUCTURE HAVING FIRST PORTION AND SECOND PORTION SURROUNDING FIRST PORTION AND FORMED OF MATERIAL DIFFERENT FROM THAT OF FIRST PORTION, AND METHOD OF MANUFACTURING THE SAME

(71) Applicant: TOSHIBA MEMORY CORPORATION, Minato-ku, Tokyo (JP)

(72) Inventors: Shuichi Tsubata, Seoul (KR); Masatoshi Yoshikawa, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/069,718

(22) Filed: Mar. 14, 2016

(65) Prior Publication Data
US 2017/0077388 A1 Mar. 16, 2017

Related U.S. Application Data

(60) Provisional application No. 62/216,693, filed on Sep. 10, 2015.

(51) Int. Cl.
| | | |
|---|---|---|
| *H01L 29/82* | (2006.01) |
| *H01L 29/84* | (2006.01) |
| *H01L 43/02* | (2006.01) |
| *H01L 43/08* | (2006.01) |
| *H01L 43/12* | (2006.01) |
| *H01L 27/22* | (2006.01) |
| *G11C 11/16* | (2006.01) |

(52) U.S. Cl.
CPC ............ *H01L 43/02* (2013.01); *H01L 27/228* (2013.01); *H01L 43/08* (2013.01); *H01L 43/12* (2013.01); *G11C 11/161* (2013.01)

(58) Field of Classification Search
CPC ............... H01L 27/222; H01L 43/02; H01L 2924/10253; H01L 21/0254; H01L 21/31144; H01L 29/1608
USPC .................................................. 257/415, 421
See application file for complete search history.

(56) References Cited

U.S. PATENT DOCUMENTS

| | | | | |
|---|---|---|---|---|
| 6,190,961 B1 * | 2/2001 | Lam | ................... | H01L 21/31116 257/E21.252 |
| 2008/0003701 A1 * | 1/2008 | Chen | ...................... | H01L 43/12 438/3 |
| 2009/0209050 A1 * | 8/2009 | Wang | ..................... | H01L 27/228 438/3 |

(Continued)

FOREIGN PATENT DOCUMENTS

| | | |
|---|---|---|
| JP | 2006120742 A | 5/2006 |
| JP | 2012199391 | * 10/2012 |

(Continued)

*Primary Examiner* — Duy T Nguyen
(74) *Attorney, Agent, or Firm* — Holtz, Holtz & Volek PC (57) ABSTRACT

According to one embodiment, a magnetic memory device includes a stacked structure including a magnetic layer, and an upper structure provided on the stacked structure, and including a first portion and a second portion surrounding the first portion and formed of material different from that of the first portion.

19 Claims, 8 Drawing Sheets (56) References Cited

U.S. PATENT DOCUMENTS

2013/0026585 A1* 1/2013 Sung ................. H01L 43/12
                                                        257/421

FOREIGN PATENT DOCUMENTS

| JP | 2012199391 A | 10/2012 |
|----|--------------|---------|
| JP | 2015008205 A | 1/2015  |

* cited by examiner

MAGNETIC MEMORY DEVICE INCLUDING UPPER STRUCTURE HAVING FIRST PORTION AND SECOND PORTION SURROUNDING FIRST PORTION AND FORMED OF MATERIAL DIFFERENT FROM THAT OF FIRST PORTION, AND METHOD OF MANUFACTURING THE SAME

CROSS-REFERENCE TO RELATED APPLICATIONS

This application claims the benefit of U.S. Provisional Application No. 62/216,693, filed Sep. 10, 2015, the entire contents of which are incorporated herein by reference.

FIELD

Embodiments described herein relate generally to a magnetic memory device and a method of manufacturing the same.

BACKGROUND

A magnetic memory device is proposed into which transistors and magnetoresistive effect elements are integrated on a semiconductor substrate. In general, a pattern of the magnetoresistive effect element is formed by performing ion beam etching (IBE) using a hard mask as a mask.

However, if the element is made more minute, there is a risk that the hard mask could not sufficiently satisfactorily function as a mask, and thus a desired magnetoresistive effect element could not be obtained.

Therefore, it is hoped that a magnetic memory device including a hard mask which can sufficiently satisfactorily function as a mark and a method of manufacturing the same will be provided.

DETAILED DESCRIPTION

In general, according to one embodiment, a magnetic memory device includes: a stacked structure including a magnetic layer; and an upper structure provided on the stacked structure, and including a first portion and a second portion surrounding the first portion and formed of material different from that of the first portion.

Embodiments will be hereinafter described with reference to the accompanying drawings.

Figure 1:
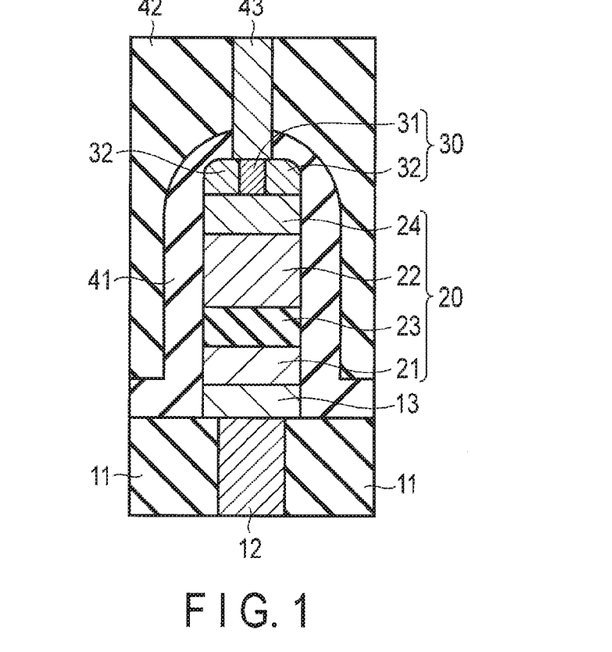
FIG. 1 is a cross-sectional view schematically showing the structure of a magnetic memory device according to an embodiment.

FIG. 1 is a cross-sectional view schematically showing the structure of a magnetic memory device (semiconductor integrated circuit device) according to an embodiment.

As shown in FIG. 1, an interlayer insulating film 11 and a bottom electrode 12 are formed on a semiconductor substrate (not shown) where a transistor (not shown) is provided. On the interlayer insulating film 11 and the bottom electrode 12, an under layer 13 is provided.

On the under layer 13, a stacked structure 20 including a magnetic layer is provided. The stacked structure 20 functions as a magnetoresistive effect element. It should be noted that the magnetoresistive effect element is also referred to as a magnetic tunnel junction (MTJ) element.

The stacked structure 20 includes a storage layer (first magnetic layer) 21 having a variable magnetization direction, a reference layer (second magnetic layer) 22 having a fixed magnetization direction, a tunnel barrier layer (nonmagnetic layer) 23 provided between the storage layer 21 and the reference layer 22, and a cap layer 24 provided on the reference layer 22. It should be noted that in an example shown in FIG. 1, the storage layer 21 is provided on a lower layer side, and the reference layer 22 is provided on an upper layer side; however, the storage layer 21 may be provided on the upper layer side, and the reference layer 22 be provided on the lower layer side.

The storage layer 21 and the reference layer 22 are formed of magnetic material containing at least one of Co, Fe and Ni. For example, the storage layer 21 and the reference layer 22 are formed of CoFeB. The tunnel barrier layer 23 is formed of MgO. The cap layer 24 is formed of Ru.

If the direction of magnetization of the storage layer 21 is parallel to that of the reference layer 22, the above magnetoresistive effect element exhibits a low resistive state. If the direction of magnetization of the storage layer 21 is anti-parallel to that of the reference layer 22, the above magnetoresistive effect element exhibits a high resistive state. Therefore, the magnetoresistive effect element can store binary information (0 or 1) in accordance with the resistive state (low resistive state and high resistive state). Furthermore, the resistive state (low resistive state and high resistive state) can be set in accordance with the direction of write current flowing in the magnetoresistive effect element.

Figure 2:
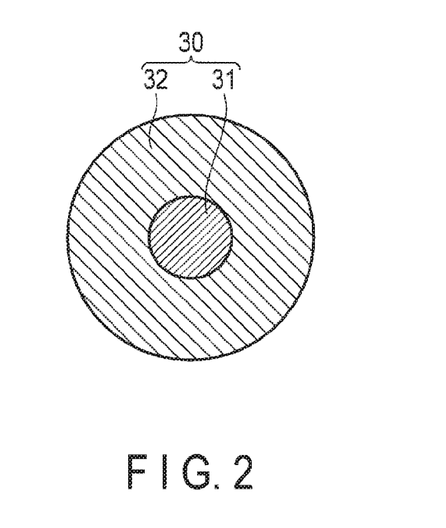
FIG. 2 is a plan view schematically showing the structure of an upper structure in the magnetic memory device according to the embodiment.

On the stacked structure 20, an upper structure 30 is provided. FIG. 2 is a plan view schematically showing the structure of the upper structure 30.

As shown in FIGS. 1 and 2, the upper structure 30 includes a first portion 31 and a second portion 32 surrounding the first portion 31. That is, the second portion 32 is provided on the entire side surface of the first portion 31. The second portion 32 is formed of material different from that of the first portion 31.

The upper structure 30 functions as a hard mask for forming the stacked structure 20. To be more specific, in the case where a pattern of the stacked structure 20 is formed by etching, the upper structure 30 is used as a hard mask. Therefore, the side surface of the stacked structure 20 is aligned with that of the upper structure 30. Also, since an upper corner of the hard mask is easily etched at the time of forming the pattern of the stacked structure 20, the upper corner of the upper structure 30 is rounded.

The stacked structure 20 and the upper structure 30 are covered by a protective insulating film 41. The protective insulating film 41 is covered by an interlayer insulating film 42. In a hole formed in the protective insulating film 41 and the interlayer insulating film 42, a top electrode 43 is provided, which is connected to the upper structure 30.

Next, the upper structure 30 will be explained in detail.

The second portion 32 of the upper structure 30 is harder than the first portion 31 thereof. That is, the second portion 32 is formed of material having higher hardness than that of the first portion 31.

The first portion 31 of the upper structure 30 is formed of an electric conductor. For example, the first portion 31 is formed of metal or metal nitride. To be more specific, the first portion 31 is formed of tungsten (W), titanium (Ti), tungsten nitride (WN) or titanium nitride (TiN).

The second portion 32 of the upper structure 30 may be formed of an electric conductor or may be formed of an insulator or a semiconductor. For example, the second portion 32 is formed of carbon or carbide. To be more specific, the second portion 32 is formed of tungsten carbide (WC), titanium carbide (TiC), silicon carbide (SiC), nitrogen carbide (CN) or diamond-like carbon (DLC).

In the present embodiment, by virtue of the above structure, it is possible to obtain a magnetic memory device having a hard mask which can sufficiently satisfactorily function as a mask. The following explanation is further added.

As described above, the upper structure 30 is used as a hard mask for forming a pattern of the stacked structure 20. More specifically, the pattern of the stacked structure 20 is formed by etching a stacked film with ion beam etching (IBE) using the upper structure 30 as a hard mark. Ordinarily, while rotating a substrate provided with a stacked film, an ion beam is radiated onto the stacked film in an oblique direction.

However, since IBE has a physically strong etching function, it also etches even the hard mask when etching the stacked film. As a result, there is a risk that during etching, the hard mask may be shrunk, and thus could not sufficiently function as a mark.

In the embodiment, the second portion 32 of the upper structure 30 is formed of material different from that of the first portion 31, and harder than the first portion 31. Thus, the etching tolerance of the second portion 32, especially, the IBE tolerance, can be enhanced. In particular, the first portion 31 can be more reliably protected by the second portion 32 from the ion beam radiated in the oblique direction. It is therefore possible to obtain a magnetic memory device having a hard mask which can sufficiently satisfactorily function as a mask, and also magnetoresistive effect elements having a desired function.

Furthermore, since the first portion 31 is formed of an electric conductor, it is ensured that the upper structure 30 has conductivity. That is, an electrical connection between the stacked structure (magnetoresistive effect element) 20 and the top electrode 43 can be reliably ensured by the first portion 31 of the upper structure 30. Furthermore, in etching, the first portion 31 is protected by the second portion 32. Thus, an appropriate electric conductor can be selected as that forming the first portion 31.

In addition, because of provision of the second portion 32, the etching tolerance of the entire upper structure 30 can be substantially enhanced. Thus, the upper structure 30 can be made thinner.

Figure 3:
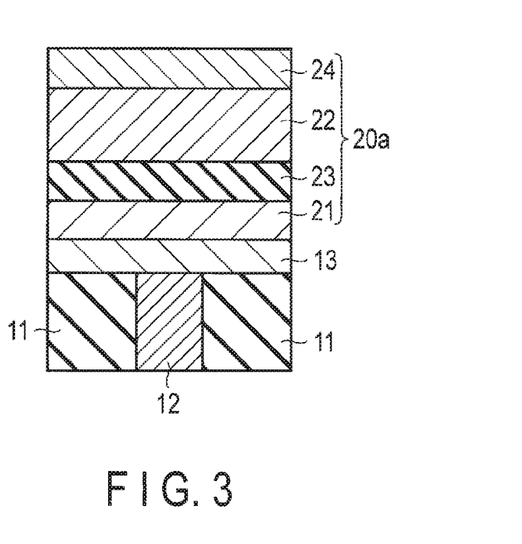
FIG. 3 is a cross-sectional view schematically showing part of a method of manufacturing the magnetic memory device according to the embodiment.
Figure 4:
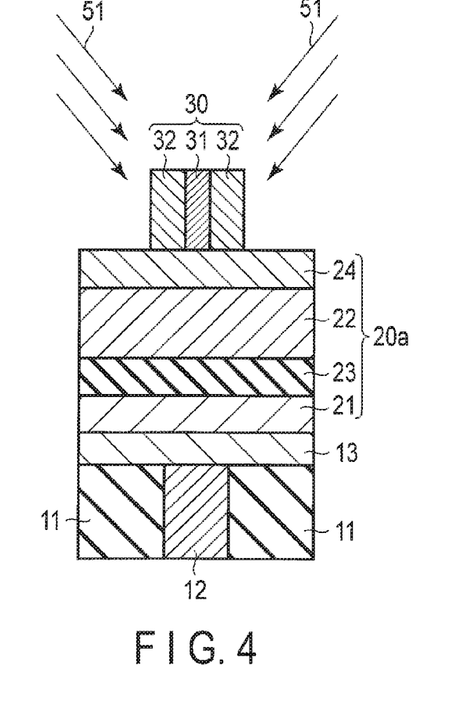
FIG. 4 is a cross-sectional view schematically showing part of the method of manufacturing the magnetic memory device according to the embodiment.
Figure 5:
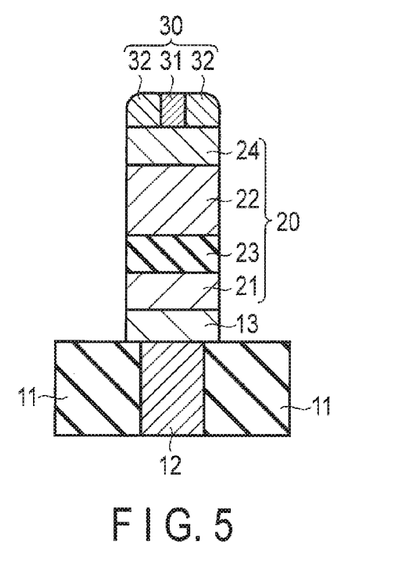
FIG. 5 is a cross-sectional view schematically showing part of the method of manufacturing the magnetic memory device according to the embodiment.

Next, the method of manufacturing the magnetic memory device according to the embodiment will be explained. FIGS. 3-5 are cross-sectional views schematically showing the manufacturing method of the magnetic memory device according to the embodiment.

First, as shown in FIG. 3, an interlayer insulating film 11 and a bottom electrode 12 are formed on a semiconductor substrate (now shown) where a transistor (not shown) is provided. Then, on the interlayer insulating film 11 and the bottom electrode 12, an under layer 13 is formed.

Next, on the under layer 13, a stacked film 20a including a magnetic layer is formed. Specifically, a stacked film 20a including a storage layer (first magnetic layer) 21, a tunnel barrier layer (nonmagnetic layer) 23, a reference layer (second magnetic layer) 22 and a cap layer 24 is formed.

Next, as shown in FIG. 4, on the stacked film 20a, an upper structure 30 is formed. As described above, the upper structure 30 includes a first portion 31 and a second portion 32 which surrounds the first portion 31, and which is formed of material different from that of the first portion 31.

Next, the stacked film 20a is etched with IBE using the upper structure 30 as a hard mask. Specifically, while rotating a substrate provided with the stacked film 20a, an ion beam 51 using Ar ions or the like is radiated onto the stacked film 20a in an oblique direction.

As a result, as shown in FIG. 5, a stacked structure 20 is formed. On the stacked structure 20, the upper structure 30 remains. Since the upper structure 30 is also etched with IBE, the thickness of the upper structure 30 is smaller than that before etching. However, etching is restricted in the lateral direction of the upper structure 30, since the second portion 32, which has a high etching tolerance (IBE tolerance), is formed at an outer peripheral portion of the upper structure 30. Thus, the shrinkage of the upper structure 30 in the lateral direction is smaller than that in a vertical direction (thickness direction). Furthermore, in this etching step, an upper corner of the upper structure 30 is rounded.

Next, as shown in FIG. 1, a protective insulating film 41 is formed to cover the stacked structure 20 and the upper structure 30, and an interlayer insulating film 42 is also formed to cover the protective insulating film 41. Then, a hole is formed in the protective insulating film 41 and the interlayer insulating film 42 to reach the upper structure 30. Furthermore, a top electrode 43 is formed in the hole to contact the upper structure 30. By the above way, such a magnetic memory device as shown in FIG. 1 is formed.

As described above, according to the manufacturing method of the embodiment, the upper structure 30 is made up of the first portion 31 and the second portion 32 surrounding the first portion 31. As a result, it is formed as an upper structure (hard mask) 30 having a high etching tolerance. Thus, the upper structure 30 can sufficiently function as a hard mask, and a magnetoresistive effect element having a desired function can be obtained.

It should be noted that in the above manufacturing method, although in the step as shown in FIG. 4, the stacked film 20a is etched with IBE, the stacked film 20a may be etched with reactive ion etching (RIE), instead of with IBE. Also, in the case of applying RIE, the same advantage as described above can be obtained.

Next, a method of forming the upper structure 30 will be explained.

FIGS. 6-12 are cross-sectional views schematically showing a first forming method of the upper structure 30. It should be noted that in FIGS. 6-12, the interlayer insulating film 11 and the bottom electrode 12 as shown in FIGS. 1 and 3-5 are omitted.

Figure 6:
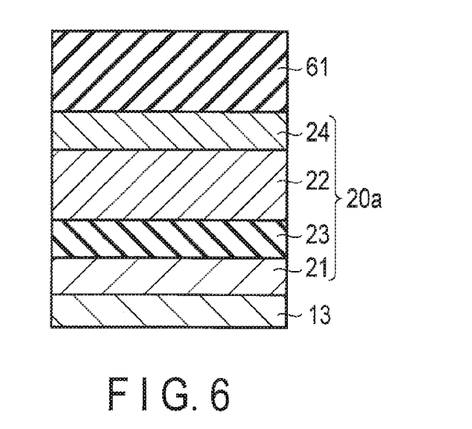
FIG. 6 is a cross-sectional view schematically showing part of a first forming method of the upper structure in the magnetic memory device according to the embodiment.

First, as shown in FIG. 6, an upper layer film 61 is formed on a stacked film 20a. The upper layer film 61 is formed of, for example, a silicon oxide film.

Figure 7:
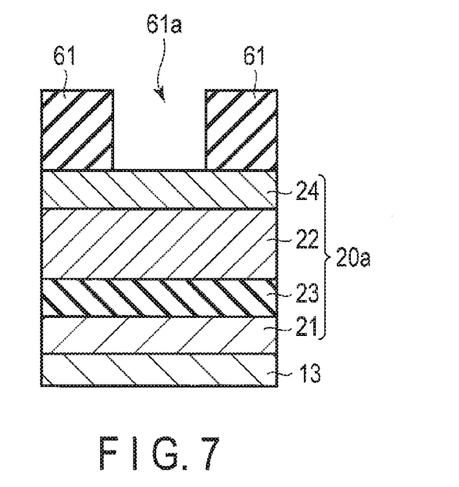
FIG. 7 is a cross-sectional, view schematically showing part of the first forming method of the upper structure in the magnetic memory device according to the embodiment.

Then, as shown in FIG. 7, a hole 61a is formed in the upper layer film 61 as a hole for formation of the upper structure 30.

Figure 8:
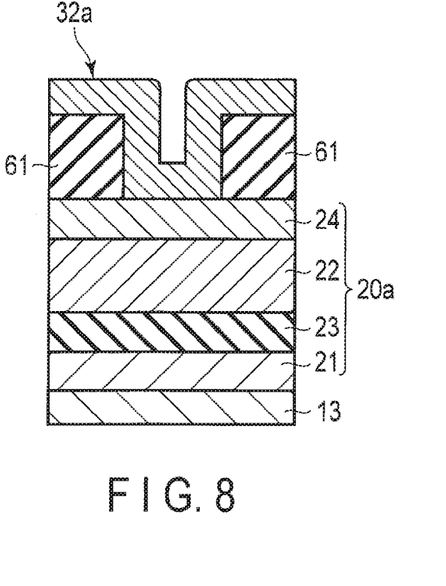
FIG. 8 is a cross-sectional view schematically showing part of the first forming method of the upper structure in the magnetic memory device according to the embodiment.

Next, as shown in FIG. 8, a carbide film 32a is formed on an inner surface of the hole 61a and the upper layer film 61. In this example, as the carbide film 32a, a tungsten carbide film (WC film) is applied.

Figure 9:
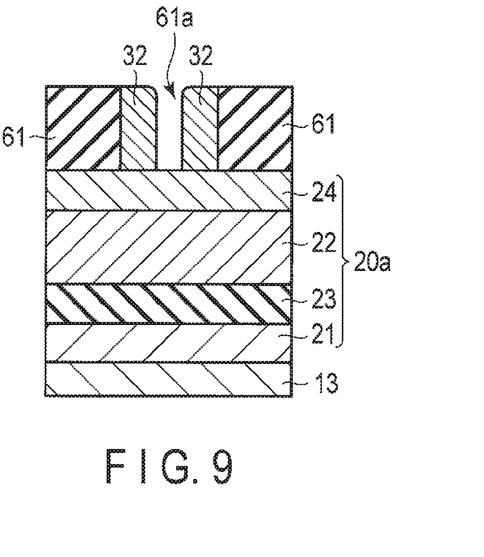
FIG. 9 is a cross-sectional view schematically showing part of the first forming method of the upper structure in the magnetic memory device according to the embodiment.

Subsequently, as shown in FIG. 9, the carbide film 32a is etched back. As a result, the carbide film 32a remains only on the inner surface of the hole 61a. The carbide film 32a remaining only the inner side surface of the hole 61a forms a second portion 32 of the upper structure 30.

Figure 10:
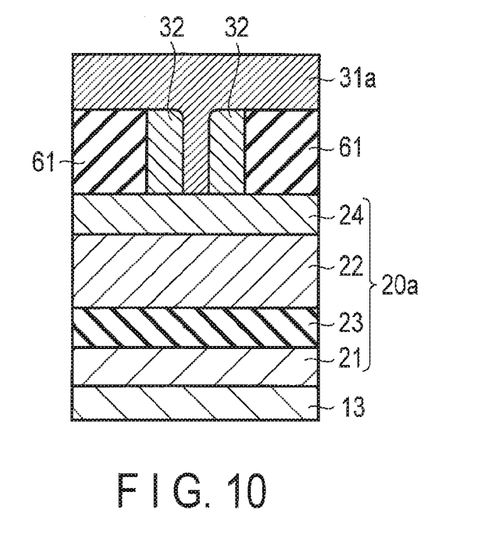
FIG. 10 is a cross-sectional view schematically showing part of the first forming method of the upper structure in the magnetic memory device according to the embodiment.

Next, as shown in FIG. 10, a metal film 31a is formed on the upper layer film 61 and in the hole 32a where the second portion 32 is provided. The metal film 31a is formed of, for example, a tungsten film (W film).

Figure 11:
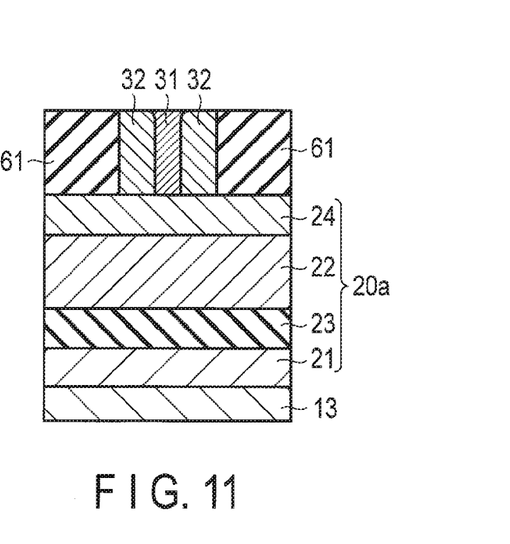
FIG. 11 is a cross-sectional view schematically showing part of the first forming method of the upper structure in the magnetic memory device according to the embodiment.

Then, as shown in FIG. 11, the metal film 31a is subjected to chemical mechanical polishing (CMP) or etched back. As a result, the metal film 31a remains only in the hole 61a where the second portion 32 is provided. The metal film 31a remaining in the hole 61a forms a first portion 31 of the upper structure 30.

Figure 12:
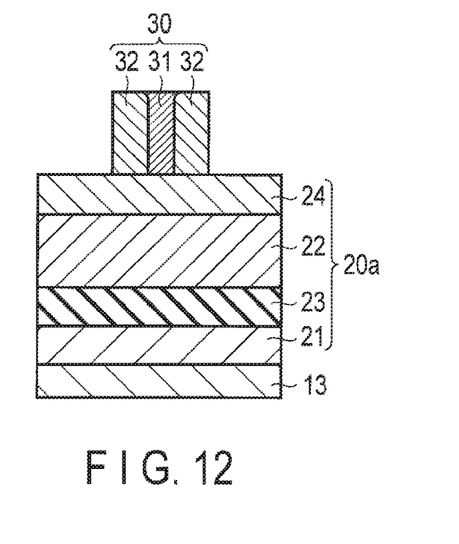
FIG. 12 is a cross-sectional view schematically showing part of the first forming method of the upper structure in the magnetic memory device according to the embodiment.

Thereafter, as shown in FIG. 12, the upper layer film 61 is removed. Thereby, an upper structure 30 including the first portion 31 and the second portion 32 is obtained.

FIGS. 13-18 are cross-sectional views schematically showing a second forming method of the upper structure 30. It should be noted that in FIGS. 13-18, the interlayer insulating film 11 and the bottom electrode 12 as shown in FIGS. 1 and 3-5 are omitted.

Figure 13:
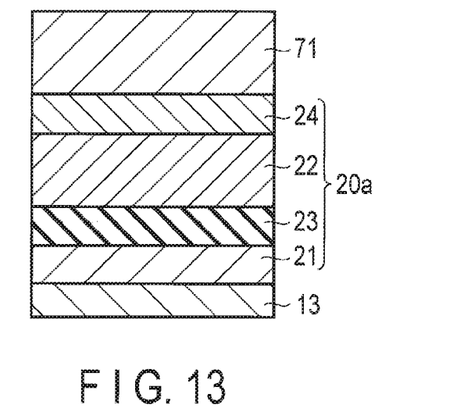
FIG. 13 is a cross-sectional view schematically showing part of a second forming method of the upper structure in the magnetic memory device according to the embodiment.

First, as shown in FIG. 13, a carbon-contained film 71 is formed on a stacked film 20a. As the carbon-contained film 71, for example, a carbon film is applied.

Figure 14:
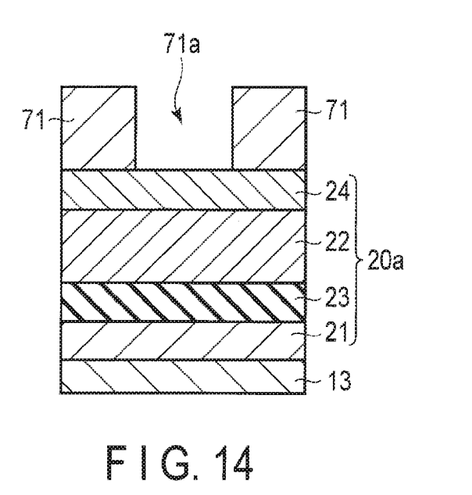
FIG. 14 is a cross-sectional view schematically showing part of the second forming method of the upper structure in the magnetic memory device according to the embodiment.

Then, as shown in FIG. 14, a hole 71a is formed in the carbon-contained film 71 as a hole for formation of the upper structure 30.

Figure 15:
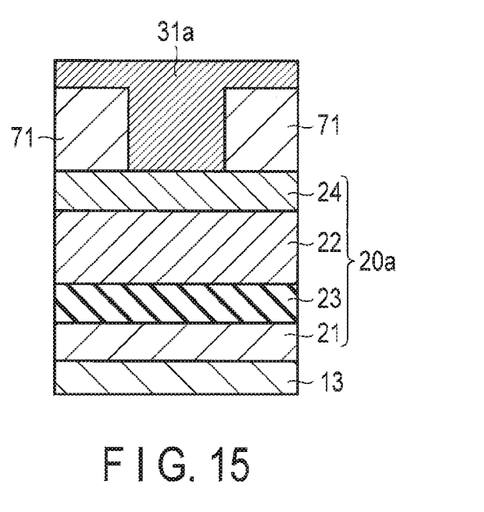
FIG. 15 is a cross-sectional view schematically showing part of the second forming method of the upper structure in the magnetic memory device according to the embodiment.

Next, as shown in FIG. 15, a metal film 31a is formed on the carbon-contained film 71 and in the hole 71a. In this embodiment, as the metal film 31a, a tungsten film (W film) is applied.

Figure 16:
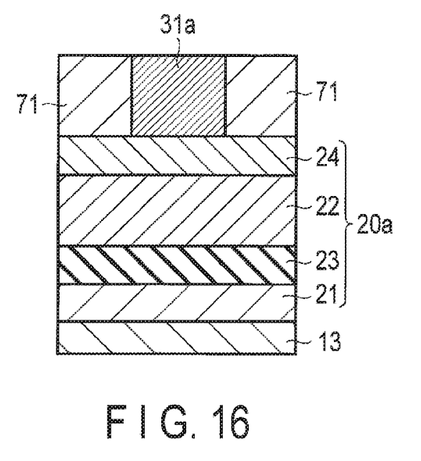
FIG. 16 is a cross-sectional view schematically showing part of the second forming method of the upper structure in the magnetic memory device according to the embodiment.

Next, as shown in FIG. 16, the metal film 31a is subjected to CMP. As a result, the metal film 31a remains only in the hole 71a.

Figure 17:
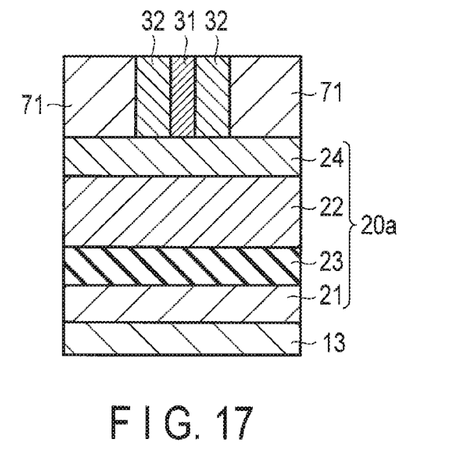
FIG. 17 is a cross-sectional view schematically showing part of the second forming method of the upper structure in the magnetic memory device according to the embodiment.

Subsequently, as shown in FIG. 17, heat treatment (annealing treatment) is performed on the carbon-contained film 71 and the metal film 31a. Due to this heat treatment, carbon contained in the carbon-contained film 71 and a metal element (tungsten in this example) contained in the metal film 31a react to interdiffuse. As a result, a carbide film (a tungsten carbide film [WC film]) 32 is formed which contains the carbon and metal element (tungsten in the example). The tungsten carbide film 32 forms a second portion 32 of the upper structure 30. Furthermore, a remaining portion which remains without reacting with the carbon contained in the carbon-contained film 71 of the metal film 31a forms a first portion 31 of the upper structure 30.

Figure 18:
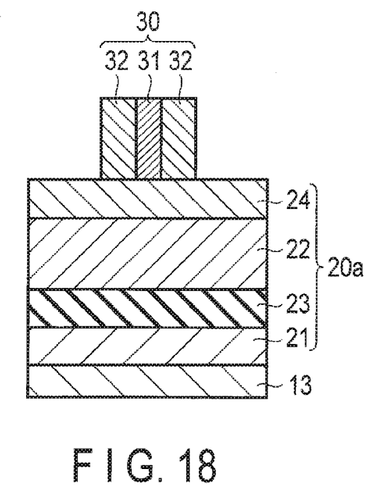
FIG. 18 is a cross-sectional view schematically showing part of the second forming method of the upper structure in the magnetic memory device according to the embodiment.

Next, as shown in FIG. 18, the carbon-contained film 71 is removed. Thereby, an upper structure 30 including the first portion 31 and the second portion 32 is obtained. That is, the upper structure 30 is obtained which includes the first portion formed of a predetermined metal element (tungsten [W] in the example) and the second portion formed of carbide of the predetermined metal element (tungsten carbide [WC] in the example).

Figure 19:
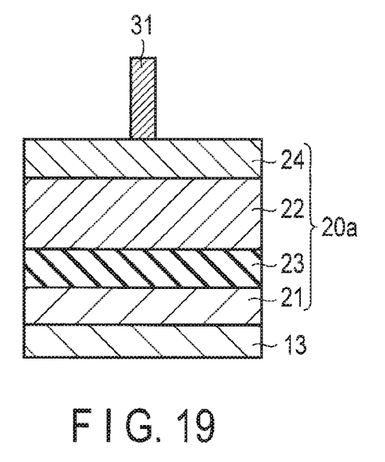
FIG. 19 is a cross-sectional view schematically showing part of a third forming method of the upper structure in the magnetic memory device according to the embodiment.
Figure 20:
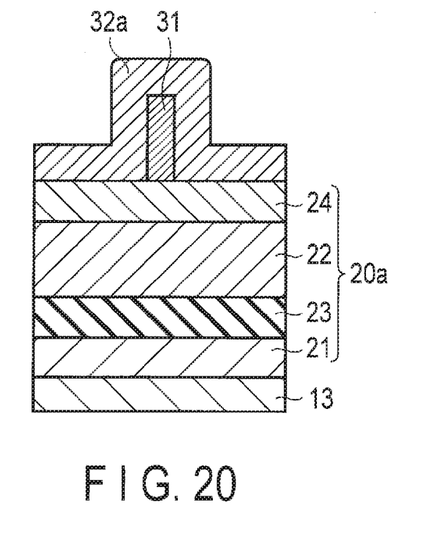
FIG. 20 is a cross-sectional view schematically showing part of the third forming method of the upper structure in the magnetic memory device according to the embodiment.
Figure 21:
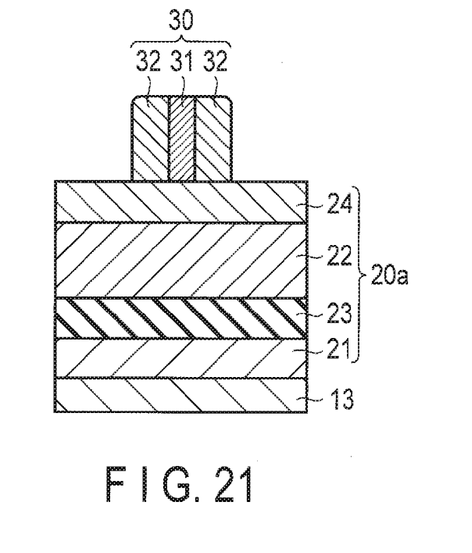
FIG. 21 is a cross-sectional view schematically showing part of the third forming method of the upper structure in the magnetic memory device according to the embodiment.

FIGS. 19-21 are cross-sectional views schematically showing a third forming method of the upper structure 30. It should be noted that in FIGS. 19-21, the interlayer insulating film 11 and the bottom electrode 12 as shown in FIGS. 1 and 3-5 are omitted.

First, as shown in FIG. 19, a metal film is formed on a stacked film 20a. In this example, as the metal film, a tungsten film (W film) is applied. Furthermore, the metal film is patterned to form a first portion 31 of the upper structure 30.

Then, as shown in FIG. 20, on the stacked film 20a, a carbide film 32a is formed to cover the first portion 31. In the example, as the carbide film 32a, a tungsten carbide film (WC film) is applied.

Next, as shown in FIG. 21, the carbide film. 32a is etched back. As a result, the carbide film 32a remains only on a side surface of the first portion 31. The carbide film 32a remaining on the side surface of the first portion 31 forms a second portion 32 of the upper structure 30. Thereby, an upper structure 30 including the first portion 31 and the second portion 32 is obtained.

Using the upper structure 30 formed by each of the first to third forming methods as a hard mark, the stacked film 20a is etched, to thereby form such a magnetic memory device as shown in FIG. 1.

Next, the structure of a magnetic memory device according to a modification of the embodiment and a method of manufacturing the magnetic memory device will be explained. It should be noted that a basic structure and a basic manufacturing method of the magnetic memory device according to the modification are similar to those according to the embodiment, and explanations of matters explained with respect to the embodiment will be omitted.

FIGS. 22-26 are cross-sectional views schematically showing the manufacturing method of the modification.

Figure 22:
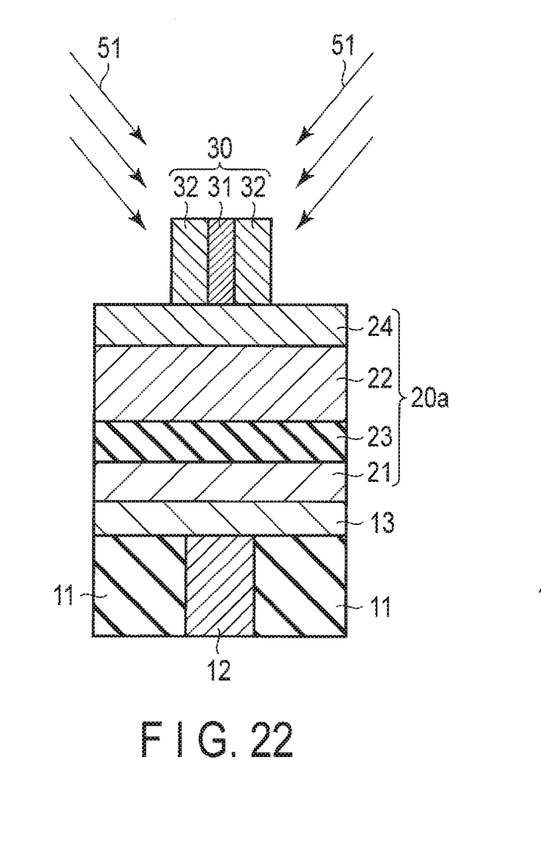
FIG. 22 is a cross-sectional view schematically showing part of a method of manufacturing a modification of the magnetic memory device according to the embodiment.

First, as shown in FIG. 22, as in the step as shown in FIG. 3 in the above embodiment, an under layer 13 is formed on an interlayer insulating film 11 and a bottom electrode 12, and a stacked film 20a including magnetic layers is formed on the under layer 13. Next, as in the step as shown in FIG. 4 in the embodiment, on the stacked film 20a, an upper structure 30 is formed. As in the above embodiment, the upper structure 30 includes a first portion 31 and a second portion 32 surrounding the first portion 31.

Figure 23:
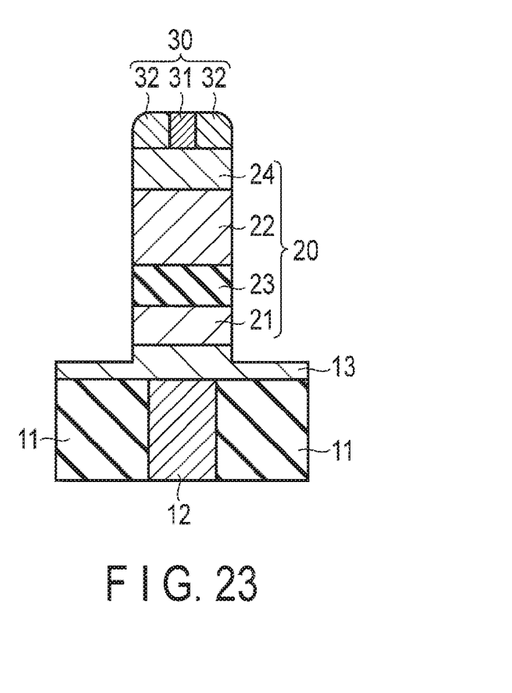
FIG. 23 is a cross-sectional view schematically showing part of the method of manufacturing the modification of the magnetic memory device according to the embodiment.

Then, as in the step as shown in FIG. 4 in the embodiment, the stacked film 20a is etched with IBE using the upper structure 30 as a hard mask. Specifically, while rotating a substrate provided with the stacked film 20a, an ion beam 51 is radiated onto the stacked film 20a in an oblique direction. As a result, as shown in FIG. 23, a stacked structure 20 is formed.

Figure 24:
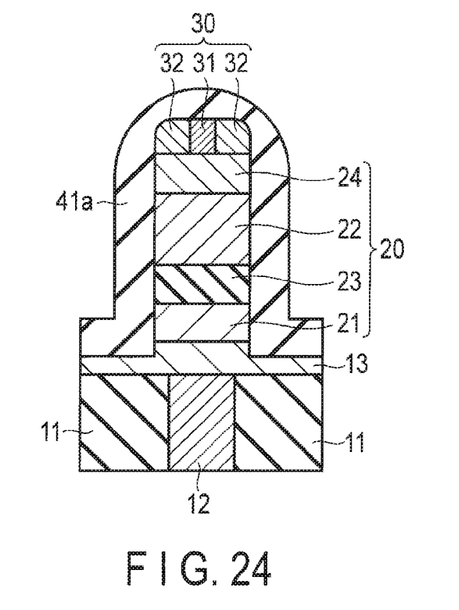
FIG. 24 is a cross-sectional view schematically showing part of the method of manufacturing the modification of the magnetic memory device according to the embodiment.

Subsequently, as shown in FIG. 24, a first protective insulating film 41a is formed to cover the stacked structure 20 and the upper structure 30.

Figure 25:
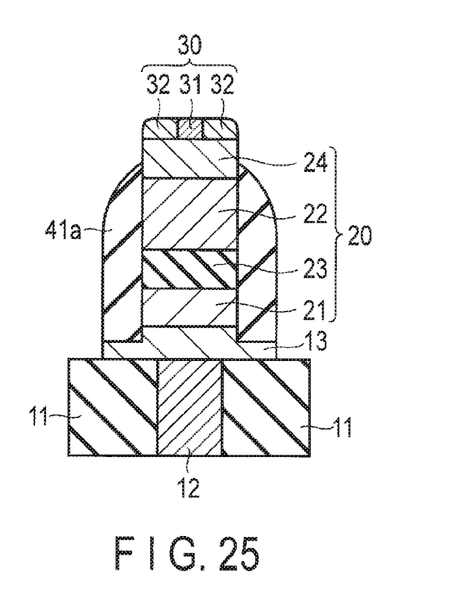
FIG. 25 is a cross-sectional view schematically showing part of the method of manufacturing the modification of the magnetic memory device according to the embodiment.

Then, as shown in FIG. 25, etching-hack processing is executed. In the etching-hack processing, IBE or RIE is applied. By the etching-back processing, the height of the first protective insulating film 41a is decreased and part of the under layer 13 is removed. Also, by the etching-back processing, the thickness of the upper structure 30 is decreased.

Figure 26:
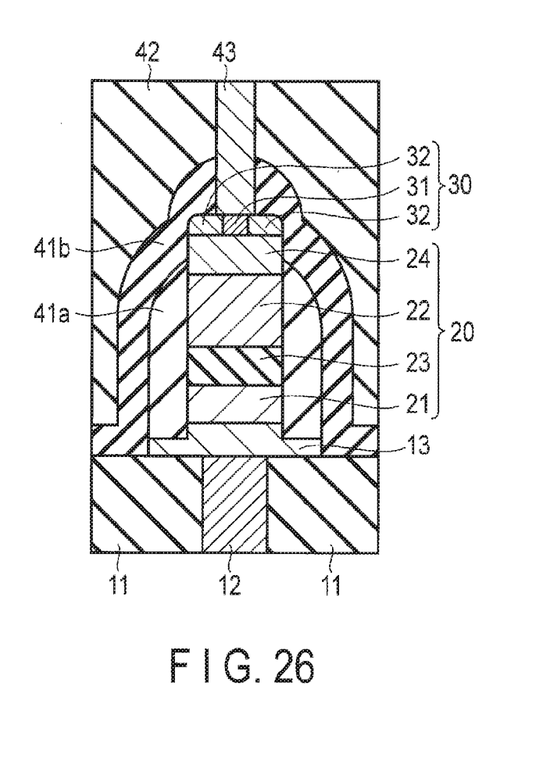
FIG. 26 is a cross-sectional view schematically showing part of the method of manufacturing the modification of the magnetic memory device according to the embodiment.

Next, as shown in FIG. 26, a second protective insulating film 41b is formed to cover the structure obtained in the step as shown in FIG. 25. Then, an interlayer insulating film 42 is formed to cover the second protective insulating film 41b. Subsequently, a hole is formed in the second protective insulating film 41b and the interlayer insulating film 42 to reach the upper structure 30. Furthermore, a top electrode 43 is formed in the hole to contact the upper structure 30.

By the above way, such a magnetic memory device as shown in FIG. 26 is formed.

In the modification, as in the above embodiment, the upper structure 30 is made up of the first portion 31 and the second portion 32 surrounding the first portion 31. Therefore, the modification can also obtain the same advantage as the embodiment.

Figure 27:
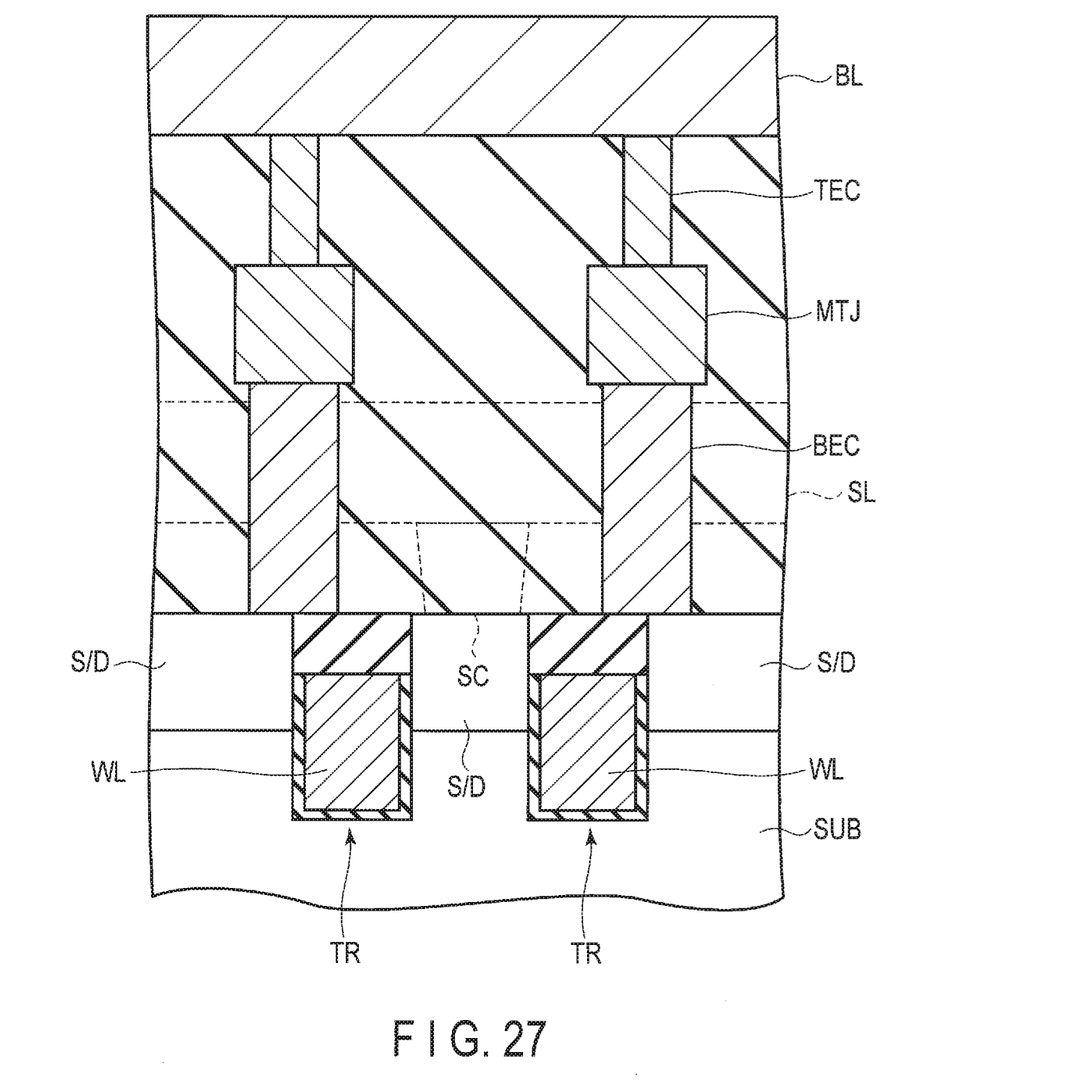
FIG. 27 is a view showing a general structure of a magnetic memory device (semiconductor integrated circuit device) using magnetoresistive effect elements.

FIG. 27 is a view showing a general structure of a magnetic memory device (semiconductor integrated circuit device) using magnetoresistive effect elements (MTJ elements).

In a semiconductor substrate SUB, buried gate type MOS transistors TR are formed. To be more specific, a gate electrode of a MOS transistor is used as a word line WL. To one of source/drain, regions S/D of the MOS transistor TR, a bottom electrode BEC is connected, and to the other of the source/drain regions, a source-line contact SC is connected.

On the bottom electrode BEC, a magnetoresistive effect element MTJ is formed, and on the magnetoresistive effect element MTJ, a top electrode TEC is formed. To the top electrode TEC, a bit line BL is connected. To the source-line contact SC, a source line SL is connected.

It is possible to obtain a superior semiconductor integrated circuit device by applying the structure and method explained with reference to each of the embodiment and the modification to such a semiconductor integrated circuit device as shown in FIG. 27.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
    a stacked structure including a magnetic layer;
    an upper structure provided on the stacked structure, and including a first portion and a second portion surrounding the first portion, the second portion being formed of a material different from a material of the first portion;
    a top electrode having a bottom end and a top end, the bottom end being connected to a top surface of the upper structure; and
    a bit line connected to the top end of the top electrode,
    wherein a side surface of the stacked structure is aligned with a side surface of the upper structure,
    wherein the bottom end of the top electrode has a width greater than a width of a top end of the first portion, and
    wherein the first portion is formed of a predetermined metal element, and the second portion is formed of carbide of the predetermined metal element.

2. The device of claim 1, wherein the first portion is formed of a conductor.

3. The device of claim 1, wherein the first portion is formed of metal or metal nitride.

4. The device of claim 1, wherein the first portion is formed of tungsten (W), titanium (Ti), tungsten nitride or titanium nitride.

5. The device of claim 1, wherein the second portion is formed of tungsten carbide or titanium carbide.

6. The device of claim 1, wherein an upper corner of the upper structure is rounded.

7. The device of claim 1, wherein the stacked structure includes a first magnetic layer having a variable magnetization direction, a second magnetic layer having a fixed magnetization direction, and a nonmagnetic layer provided between the first magnetic layer and the second magnetic layer.

8. A magnetic memory device comprising:
a stacked structure including a magnetic layer;
an upper structure provided on the stacked structure, and including a first portion and a second portion surrounding the first portion, the second portion being formed of a material different from a material of the first portion;
a top electrode having a bottom end and a top end, the bottom end being connected to a top surface of the upper structure;
a bit line connected to the top end of the top electrode; and
a protective insulating film covering the stacked structure and the upper structure,
wherein a side surface of the stacked structure is aligned with a side surface of the upper structure,
wherein an upper corner of the second portion is rounded, and
wherein an upper part of the protective insulating film is rounded and has a hole, and an inner surface of the hole is in contact with a side surface of the top electrode.

9. The device of claim 8, wherein the first portion is formed of a conductor.

10. The device of claim 8, wherein the first portion is formed of metal or metal nitride.

11. The device of claim 8, wherein the first portion is formed of tungsten (W), titanium (Ti), tungsten nitride or titanium nitride.

12. The device of claim 8, wherein the second portion is formed of tungsten carbide, titanium carbide, silicon carbide, nitrogen carbide or diamond-like carbon (DLC).

13. A magnetic memory device comprising:
a stacked structure including a magnetic layer;
an upper structure provided on the stacked structure, and including a first portion and a second portion surrounding the first portion, the second portion being formed of a material different from a material of the first portion;
a top electrode having a bottom end and a top end, the bottom end being connected to a top surface of the upper structure; and
a bit line connected to the top end of the top electrode,
wherein a side surface of the stacked structure is aligned with a side surface of the upper structure,
wherein an upper corner of the second portion is rounded, and
wherein the first portion is formed of a predetermined metal element, and the second portion is formed of carbide of the predetermined metal element.

14. The device of claim 8, wherein the stacked structure includes a first magnetic layer having a variable magnetization direction, a second magnetic layer having a fixed magnetization direction, and a nonmagnetic layer provided between the first magnetic layer and the second magnetic layer.

15. The device of claim 13, wherein the first portion is formed of a conductor.

16. The device of claim 13, wherein the first portion is formed of metal or metal nitride.

17. The device of claim 13, wherein the first portion is formed of tungsten (W), titanium (Ti), tungsten nitride or titanium nitride.

18. The device of claim 13, wherein the second portion is formed of tungsten carbide or titanium carbide.

19. The device of claim 13, wherein the stacked structure includes a first magnetic layer having a variable magnetization direction, a second magnetic layer having a fixed magnetization direction, and a nonmagnetic layer provided between the first magnetic layer and the second magnetic layer.

* * * * *